(12) United States Patent
Yamada et al.

(10) Patent No.: US 10,332,845 B2
(45) Date of Patent: Jun. 25, 2019

(54) SEMICONDUCTOR DEVICE

(71) Applicant: FUJI ELECTRIC CO., LTD., Kanagawa (JP)

(72) Inventors: Takafumi Yamada, Matsumoto (JP); Hiromichi Gohara, Matsumoto (JP); Ryoichi Kato, Matsumoto (JP); Kohei Yamauchi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/826,669

(22) Filed: Nov. 29, 2017

(65) Prior Publication Data

US 2018/0166397 A1  Jun. 14, 2018

(30) Foreign Application Priority Data

Dec. 9, 2016 (JP) .................. 2016-239141

(51) Int. Cl.
*H01L 23/00* (2006.01)
*H01L 23/31* (2006.01)
(Continued)

(52) U.S. Cl.
CPC ............ *H01L 23/562* (2013.01); *H01L 23/00* (2013.01); *H01L 23/24* (2013.01); *H01L 23/31* (2013.01); *H01L 23/3114* (2013.01); *H01L 23/36* (2013.01); *H01L 23/3672* (2013.01); *H01L 23/3735* (2013.01); *H01L 23/50* (2013.01); *H01L 23/58* (2013.01); *H01L 23/585* (2013.01); *H01L 24/32* (2013.01); *H01L 24/40* (2013.01); *H01L 24/73* (2013.01); *H01L 25/07* (2013.01); *H01L 25/18* (2013.01); *H01L 24/84* (2013.01); *H01L 2224/32225* (2013.01); *H01L 2224/40095* (2013.01); *H01L 2224/40225* (2013.01);
(Continued)

(58) Field of Classification Search
CPC ............ H01L 2224/83; H01L 2224/84; H01L 2224/73263; H01L 24/37; H01L 24/40; H01L 24/84; H01L 2924/35; H01L 2924/3512; H01L 2924/35121; H01L 2224/400095; H01L 2224/4046
See application file for complete search history.

(56) References Cited

FOREIGN PATENT DOCUMENTS

| JP | 2003-115512 A | 4/2003 | |
|----|---------------|--------|---|
| JP | 2003115512 A * | 4/2003 | ............ H01L 24/40 |

(Continued)

*Primary Examiner* — Frederick B Hargrove (57) ABSTRACT

A semiconductor device includes: an upper-surface electrode on an upper surface of a semiconductor element; a plated layer on an upper surface of the upper-surface electrode; gate runners penetrating the plated layer and formed to extend above the upper surface of the semiconductor element; and a metal connecting plate arranged above the plated layer and electrically connected to the upper-surface electrode, wherein the metal connecting plate has a joint portion parallel to the upper surface of the semiconductor element and has a rising portion at an end of the joint portion, the rising portion extending in a direction away from the semiconductor element, and in a plane parallel to the upper surface of the semiconductor element, a first distance, which is a shortest distance between the rising portion and the gate runner not intersecting the rising portion, is equal to or longer than 1 mm.

10 Claims, 11 Drawing Sheets

(51) Int. Cl.
  *H01L 23/367*   (2006.01)
  *H01L 23/373*   (2006.01)
  *H01L 23/58*    (2006.01)
  *H01L 23/50*    (2006.01)
  *H01L 25/07*    (2006.01)
  *H01L 25/18*    (2006.01)
  *H01L 23/24*    (2006.01)
  *H01L 23/36*    (2006.01)

(52) U.S. Cl.
  CPC ............... *H01L 2224/73263* (2013.01); *H01L 2224/84801* (2013.01); *H01L 2924/00014* (2013.01); *H01L 2924/3512* (2013.01)

(56) References Cited

FOREIGN PATENT DOCUMENTS

| JP | 2006-210519 A |   | 8/2006  |           |
|----|---------------|---|---------|-----------|
| JP | 2006210519 A  | * | 8/2006  | H01L 24/34 |
| JP | 2007-035913 A |   | 2/2007  |           |
| JP | 2010-287726 A |   | 12/2010 |           |
| JP | 2013-009014 A |   | 1/2013  |           |

* cited by examiner

SEMICONDUCTOR DEVICE

The contents of the following Japanese patent application are incorporated herein by reference:
NO. 2016-239141 filed on Dec. 9, 2016.

BACKGROUND

1. Technical Field

The present invention relates to a semiconductor device.

2. Related Art

Conventionally, a structure in which a metal connecting plate such as a lead frame is connected to an upper-surface electrode of a semiconductor element has been known (for example, see Patent Document 1). The metal connecting plate has a plate-like joint portion connected to the upper-surface electrode and has a rising portion provided to extend upward from an end of the joint portion.
Patent Document 1: Japanese Patent Application Publication No. 2003-115512

A semiconductor element and a metal connecting plate are sealed with resin. If the temperature of the metal connecting plate varies, a rising portion of the metal connecting plate tries to expand or contract in the upward and downward directions. Because the upper side of the rising portion is pressed with sealing resin, the rising portion presses an upper-surface electrode of the semiconductor element. As a result, strain caused in the region of the upper-surface electrode in the vicinity of the rising portion becomes larger than that in the other region of the upper-surface electrode.

The upper surface of the upper-surface electrode of the semiconductor element is plated with nickel or the like. The plated film is divided into a plurality of regions by a gate runner coated with an insulating film such as polyimide. As a result, a boundary portion between the plated film and the gate runner becomes a triple junction where three members, namely, the upper-surface electrode such as aluminum, the plated film, and the gate runner converge.

If a gap is generated at the boundary between the plated film and the gate runner due to contraction or the like of the insulating film of the gate runner, solder enters into the gap. If the strain becomes larger in the vicinity of the triple junction in this state, a crack may be generated in the upper-surface electrode such as aluminum.

SUMMARY

An aspect of the present invention provides a semiconductor device. The semiconductor device may include a semiconductor element. The semiconductor device may include an upper-surface electrode formed on an upper surface of the semiconductor element. The semiconductor device may include a plated layer formed on an upper surface of the upper-surface electrode. The semiconductor device may include one or more gate runners penetrating the plated layer and formed to extend in a predetermined direction above the upper surface of the semiconductor element. The semiconductor device may include a metal connecting plate arranged above the plated layer and electrically connected to the upper-surface electrode. The metal connecting plate may have a joint portion parallel to the upper surface of the semiconductor element. The metal connecting plate may have a rising portion at an end of the joint portion, the rising portion extending in a direction away from the upper surface of the semiconductor element. In a plane parallel to the upper surface of the semiconductor element, a first distance, which is a shortest distance between the rising portion and the gate runner not intersecting the rising portion, may be equal to or longer than 1 mm.

The semiconductor device may include a guard ring formed on the upper surface of the upper-surface electrode and outside the plated layer. In the plane parallel to the upper surface of the semiconductor element, a second distance, which is a shortest distance between the guard ring and the rising portion, may be equal to or longer than 1 mm. The first distance may be longer than the second distance.

The semiconductor device may further include a solder portion provided between the metal connecting plate and the plated layer. The solder portion may not be in contact with the guard ring. A curved portion whose radius of curvature is equal to or longer than 1 mm may be provided at a boundary portion between the rising portion and the joint portion.

In the plane parallel to the upper surface of the semiconductor element, a third distance, which is a shortest distance between an end of the joint portion and the gate runner not intersecting the end, with the end opposite to the rising portion, may be equal to or longer than 1 mm. The third distance may be shorter than the first distance.

In the plane parallel to the upper surface of the semiconductor element, the rising portion may not intersect with any of the gate runners. In the plane parallel to the upper surface of the semiconductor element, the plated layer may be divided into a plurality of compartments by the gate runner. The rising portion may be provided above a compartment that is largest of the compartments of the plated layer.

In the plane parallel to the upper surface of the semiconductor element, the rising portion may be arranged along a longitudinal direction of the semiconductor element. The semiconductor device may further include a gate pad arranged on the upper surface of the semiconductor element. The rising portion may be provided at an end of the joint portion, with the end opposite to the gate pad.

The summary clause does not necessarily describe all necessary features of the embodiments of the present invention. The present invention may also be a sub-combination of the features described above.

DESCRIPTION OF EXEMPLARY
EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
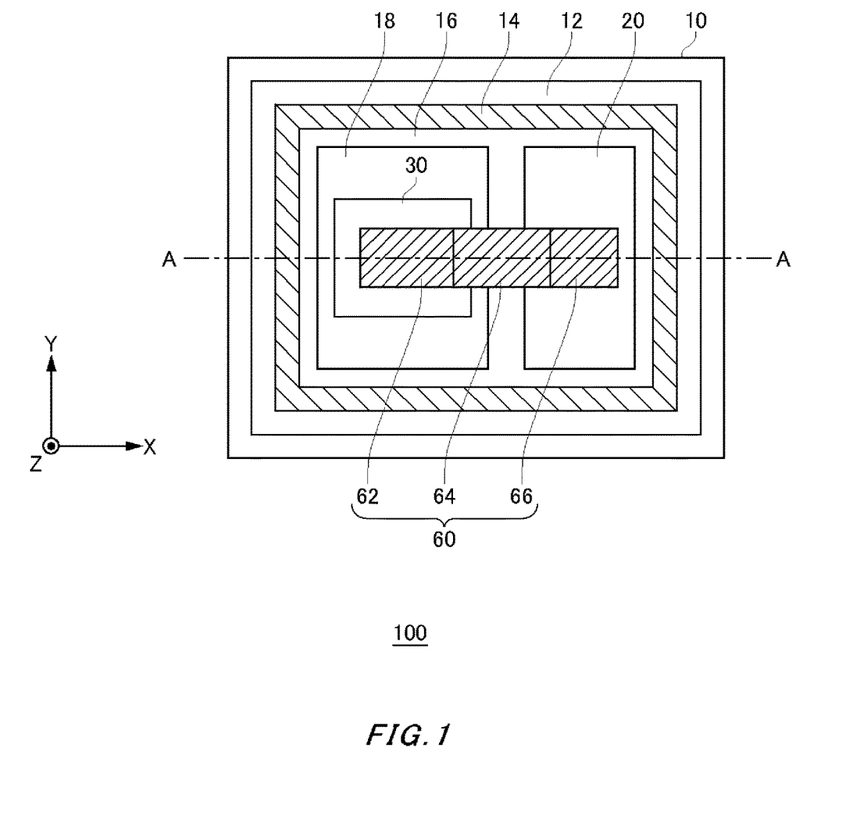
FIG. 1 is a diagram showing an upper surface of a semiconductor device 100 according to an embodiment of the present invention.
Figure 2:
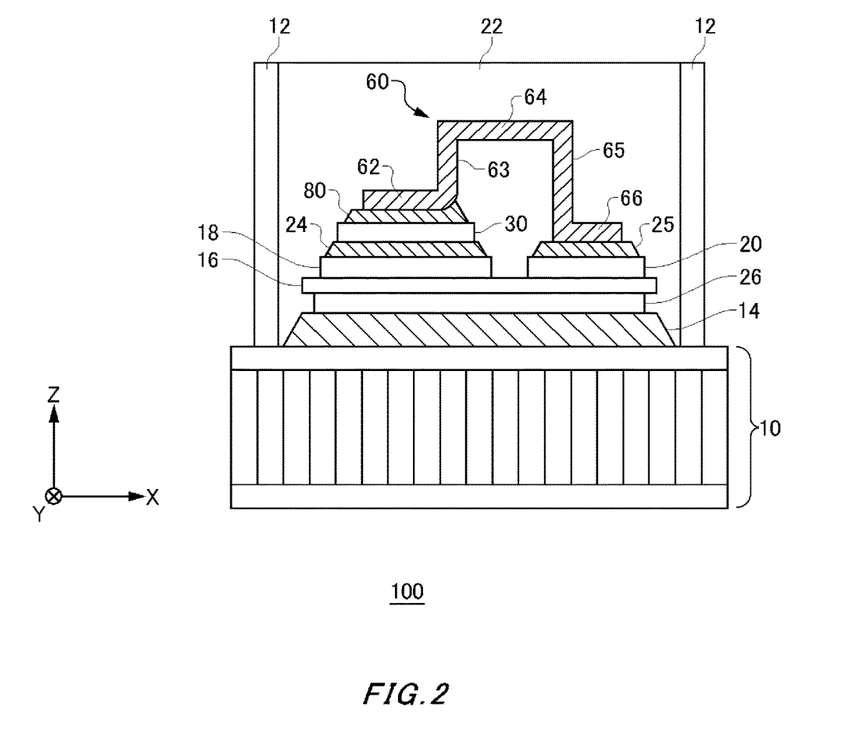
FIG. 2 is a diagram showing cross section taken along a line A-A in FIG. 1.

FIG. 1 is a diagram showing an upper surface of a semiconductor device 100 according to an embodiment of the present invention. FIG. 2 is a diagram showing cross section taken along a line A-A in FIG. 1. Hereinafter, one direction of the thickness directions of a semiconductor element 30, which will be described later, is referred to as an 'upward' direction, and the other direction is referred to as a 'downward' direction. Out of two principal surfaces of an element, a substrate, a layer, a film, or other members, one principal surface is referred to as an upper surface, and the other principal surface is referred to as a lower surface. The 'upward' and 'downward' directions are not limited to the gravity direction. In the present example, the upward and downward directions is referred to as Z-axis direction, and two directions orthogonal to each other in a plane perpendicular to the Z-axis direction are referred to as X-axis direction and Y-axis direction.

The semiconductor device 100 of the present example includes a cooling portion 10, a case 12, a solder portion 14, an insulating substrate 16, a metal plate 26, a circuit portion 18, a circuit portion 20, a solder portion 24, a solder portion 25, a semiconductor element 30, a metal connecting plate 60, and a solder portion 80. The semiconductor element 30 is a semiconductor chip formed in a semiconductor substrate such as a silicon substrate. The semiconductor element 30 may include an insulated gate bipolar transistor (IGBT), a power MOSFET, a free wheel diode (FWD), or the like. The semiconductor element 30 may also include an RC-IGBT (Reverse-Conducting IGBT) in which an IGBT and an FWD are provided in one chip. On an upper surface of the semiconductor element 30, an upper-surface electrode such as an emitter electrode, a source electrode, or an anode electrode is formed.

The cooling portion 10 releases heat generated from the semiconductor element 30 and the like to the outside. The cooling portion 10 is formed of material with a high thermal conductivity such as aluminum. The cooling portion 10 may have a plurality of fins in order to increase the heat-releasing area.

A laminated substrate is provided on an upper surface of the cooling portion 10. The laminated substrate of the present example is a DCB (Direct Copper Bonding) substrate configured with the insulating substrate 16, the metal plate 26, the circuit portion 18, and the circuit portion 20.

The insulating substrate 16 is formed of insulating material such as ceramic. The metal plate 26 is provided on the lower surface of the insulating substrate 16. The circuit portion 18 and the circuit portion 20 are provided on an upper surface of the insulating substrate 16. The solder portion 14 thermally and mechanically fixes the metal plate 26 and the cooling portion 10 to each other. The solder portion 14 is preferably a solder with a high strength such as Sn—Sb based or Sn—Sb—Ag based solder.

The circuit portion 18 and the circuit portion 20 are each electrically connected to the semiconductor element 30. The circuit portion 18 and the circuit portion 20 each transfer and receive power, electrical signals, and the like to and from the semiconductor element 30. The circuit portion 18 and the circuit portion 20 may include a metal wiring, a pad, and the like formed on the upper surface of the insulating substrate 16 and may include a signal processing circuit and the like.

The semiconductor element 30 is provided on the upper surface of the circuit portion 18. The semiconductor element 30 is fixed to the circuit portion 18 by the solder portion 24. The solder portion 24 electrically and mechanically connects the semiconductor element 30 and the circuit portion 18 to each other. For example, the solder portion 24 connects a pad and the like included in the circuit portion 18 and a terminal of the semiconductor element 30. The solder portion 24 is, for example, Sn—Cu based or Sn—Sb based solder. The semiconductor element 30 is also electrically connected to the circuit portion 20 via the metal connecting plate 60. One end of the metal connecting plate 60 is connected to the upper surface of the semiconductor element 30, and the other end of the metal connecting plate 60 is connected to the upper surface of the circuit portion 20.

For example, the metal connecting plate 60 is formed of copper, copper alloy, aluminum, aluminum alloy, or the like. The thickness of the metal connecting plate 60 is equal to or longer than 0.5 mm and equal to or shorter than 1 mm, for example. The metal connecting plate 60 has a joint portion 62 connected to the upper surface of the semiconductor element 30, a joint portion 66 connected to the upper surface of the circuit portion 20, and a connection portion 64 that connects the two joint portions, namely, the joint portion 62 and the joint portion 66. The joint portion 62 may be arranged in parallel to the upper surface of the semiconductor element 30. The joint portion 66 may be arranged in parallel to the upper surface of the circuit portion 20.

The joint portion 62 is fixed to the semiconductor element 30 by the solder portion 80. The joint portion 66 is fixed to the circuit portion 20 by the solder portion 25. The solder portion 80 and the solder portion 25 are, for example, Sn—Cu based or Sn—Sb based solder.

A rising portion 63 is provided between the joint portion 62 and the connection portion 64. Arising portion 65 is also provided between the joint portion 66 and the connection portion 64. At an end of the joint portion 62, the rising portion 63 extends in a direction away from the upper surface of the semiconductor element 30. At an end of the joint portion 66, the rising portion 65 extends in a direction away from the upper surface of the circuit portion 20. The rising portion 63 and the rising portion 65 of the present example extend in a direction perpendicular to the upper surface of the semiconductor element 30 and the upper surface of the circuit portion 20 (that is, the Z-axis direction).

On the upper surface of the cooling portion 10, the case 12 is provided to surround the laminated substrate, the semiconductor element 30, the metal connecting plate 60, and each solder portion. The case 12 of the present example has a frame shape. The case 12 may be formed of conductive material such as metal or may be formed of insulating material such as resin. The inside of the case 12 is sealed with a sealing resin 22. That is, the laminated substrate, the semiconductor element 30, the metal connecting plate 60, and each solder portion are entirely covered with the sealing resin 22.

Figure 3:
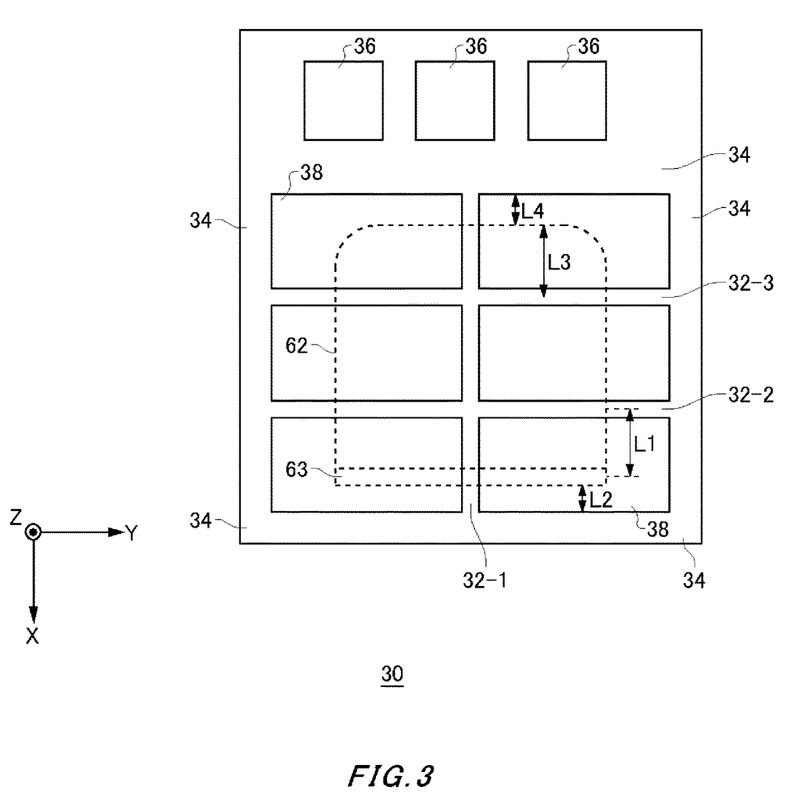
FIG. 3 is a diagram showing an exemplary upper surface of a semiconductor element 30.
Figure 4:
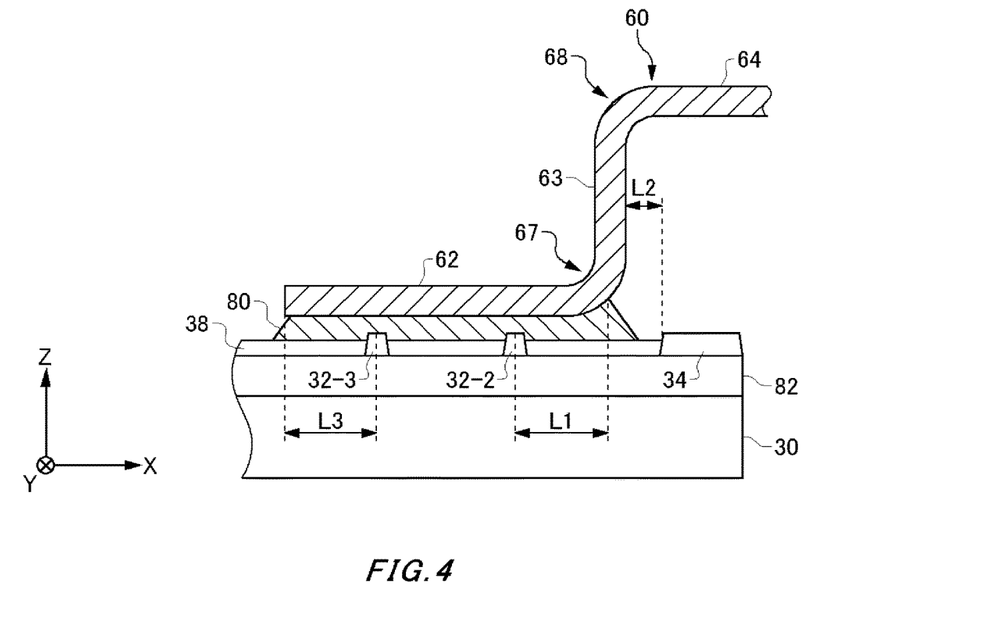
FIG. 4 is a diagram showing an exemplary XZ cross section of the semiconductor element 30 and a metal connecting plate 60.

FIG. 3 is a diagram showing an exemplary upper surface of the semiconductor element 30. FIG. 4 is a diagram showing an exemplary XZ cross section of the semiconductor element 30 and the metal connecting plate 60. In FIG. 3, broken lines show positions at which the joint portion 62 and the rising portion 63 of the metal connecting plate 60 are provided. On or above the upper surface of the semiconductor element 30, an upper-surface electrode 82, a plated layer 38, one or more gate runners 32, and a guard ring 34 are provided.

The upper-surface electrode 82 is formed in a predetermined region of the upper surface of the semiconductor element 30. On the upper surface of the semiconductor element 30, one or more pads 36 may be formed in a region separate from the upper-surface electrode 82. The upper-surface electrode 82 is, for example, an emitter electrode, a source electrode, or an anode electrode. The pad 36 is, for example, a gate electrode pad, an electrode for detecting the temperature, or the like.

The plated layer 38 is formed on an upper surface of the upper-surface electrode 82. The plated layer 38 contains, for example, Ni, Ni/Au, Sn, or the like. The plated layer 38 may be formed on the entire upper surface of the upper-surface electrode 82. Each gate runner 32 penetrates the plated layer 38 in the Z-axis direction. That is, the lower end of the gate runner 32 is in contact with the upper-surface electrode 82, and the upper end of the gate runner 32 protrudes from the plated layer 38.

The gate runner 32 has a conductive portion formed of material such as polysilicon that is doped with impurities, and has an insulating portion formed of polyimide or the like that coats the conductive portion. The insulating portion insulates the conductive portion from the plated layer 38, the upper-surface electrode 82, and the solder portion 80. Each gate runner 32 is formed to extend in a predetermined direction above the upper surface of the semiconductor element 30. For example, each gate runner 32 is provided to be linear on the XY plane. The conductive portion of the gate runner 32 is electrically connected to the pad 36 and a control electrode of a transistor or the like formed in the semiconductor element 30.

In the example of FIG. 3, a first gate runner 32-1 is formed from an end to the other end of the plated layer 38 in the X-axis direction. A second gate runner 32-2 and a third gate runner 32-3 are formed in parallel to each other from an end to the other end of the plated layer 38 in the Y-axis direction. The plated layer 38 is thereby divided into six compartments.

The guard ring 34 is formed on the upper surface of the upper-surface electrode 82 and outside the plated layer 38. The term 'outside' indicates a position closer to an end of the upper surface of the semiconductor element 30. On the upper surface of the upper-surface electrode 82, the guard ring 34 of the present example is provided to surround the entire plated layer 38. The guard ring 34 may be formed along the periphery of the upper-surface electrode 82.

The metal connecting plate 60 is arranged above the plated layer 38 and is electrically connected to the upper-surface electrode 82 via the solder portion 80 and the plated layer 38. The joint portion 62 and the rising portion 63 of the metal connecting plate 60 are arranged in a region where the upper-surface electrode 82 and the plated layer 38 are formed. That is, the joint portion 62 and the rising portion 63 are arranged on the inner side relative to the guard ring 34.

Above the upper surface of the semiconductor element 30, the rising portion 63 of the metal connecting plate 60 has a linear shape extending in a predetermined direction. The rising portion 63 of the example of FIG. 3 extends in the Y-axis direction and is arranged in parallel to the second gate runner 32-2 and the third gate runner 32-3. Note that, above the upper surface of the semiconductor element 30, the rising portion 63 of the present example is arranged to perpendicularly intersect the first gate runner 32-1.

As described above, the metal connecting plate 60 is sealed with the sealing resin 22. As a result, the upper side of the rising portion 63 is held by the sealing resin 22 if the rising portion 63 tries to expand or contract in the upward and downward directions in response to a temperature change. The rising portion 63 accordingly presses or pulls the solder portion 80, the plated layer 38, and the upper-surface electrode 82.

On the other hand, on the upper surface of the upper-surface electrode 82, a triple junction where the insulating portion of the gate runner 32, the plated layer 38, and the upper-surface electrode 82 converge, is present. The triple junction herein is a boundary region between the plated film and the gate runner and refers to a portion where the upper-surface electrode, the plated film, and the gate runner converge. At the triple junction, a gap is prone to be generated due to factors such as thermal contraction of the insulating portion of the gate runner 32, and solder is prone to enter into the gap. If pressing or the like by the rising portion 63 causes a large strain at the triple junction, a crack may be generated in the upper-surface electrode 82 formed of aluminum or the like.

For this reason, the triple junction is preferably not present at a position directly beneath the rising portion 63, the position where the large strain is prone to be generated. In the present example, in the plane parallel to the upper surface of the semiconductor element 30, a first distance L1, which is the shortest distance between the rising portion 63 and the gate runner 32 not intersecting with the rising portion 63, is equal to or longer than 1 mm. In the present example, the shortest distance between the rising portion 63 and the second gate runner 32-2 is equal to or longer than 1 mm. The second gate runner 32-2 is closest to the rising portion 63 of all the plurality of gate runners 32 along the Y-axis direction.

By making the first distance L1 equal to or longer than 1 mm, strain at the triple junction can be reduced even if the temperature change occurs. As a result, generation of cracks in the upper-surface electrode 82 can be suppressed, and the life of the semiconductor device 100 can be prolonged. The first distance L1 may be equal to or longer than 1.2 mm or equal to or longer than 1.5 mm. In the present example, the reference positions of the rising portion 63 and the gate runner 32 in the first distance L1 are their respective central positions in the X-axis direction.

Note that the triple junction is present also in the gate runner 32-1 intersecting the rising portion 63. However, the strain becomes large only in the vicinity of the portion intersecting the rising portion 63, so that cracks are relatively unlikely to be generated in the upper-surface electrode 82. As a result, the life of the semiconductor device 100 can efficiently be prolonged by increasing the distance between the rising portion 63 and the gate runner 32 not intersecting the rising portion 63, particularly, the gate runner 32 provided in parallel to the rising portion 63.

Similarly, the triple junction is present also at the boundary between the guard ring 34 and the plated layer 38. For this reason, in the plane parallel to the upper surface of the semiconductor element 30, the distance between the rising portion 63 and the guard ring 34 is preferably increased. The distance between the rising portion 63 and the guard ring 34 is preferably long to the extent that the solder portion 80 is not in contact with the guard ring 34. The entry of solder into the gap at the triple junction can thereby be suppressed, and the life of the semiconductor device 100 can be prolonged. In the present example, a second distance L2, which is the shortest distance between the rising portion 63 and the guard ring 34, is equal to or longer than 1 mm. In the present example, reference positions of the rising portion 63 and the guard ring 34 in the second distance L2 are end positions facing each other in the X-axis direction.

The rising portion 63 of the present example is arranged between the guard ring 34 and any one of the gate runners 32. In this case, the first distance L1 between the rising portion 63 and the gate runner 32 may be made longer than the second distance L2 between the rising portion 63 and the guard ring 34. Because the solder portion 80 is provided on the gate runner 32, solder is prone to enter between the gate runner 32 and the plated layer 38. For this reason, the strain at the triple junction of the gate runner 32 is reduced by increasing the first distance L1, and the life of the semiconductor device 100 can be further prolonged. The first distance L1 may be equal to or longer than 1.5 times or equal to or longer than twice the second distance L2.

Note that the distance between the gate runner 32-2 and the guard ring 34 in the X-axis direction may be X mm, and the upper limit of the first distance L1 may be X−1 mm. That is, the first distance L1 may be maximized, with the second distance L2 secured to a degree that the solder portion 80 does not reach the guard ring 34.

A curved portion 67 is also preferably provided at the boundary portion between the rising portion 63 and the joint portion 62 of the metal connecting plate 60. The curved portion 67 is formed intentionally to have a curved surface, and the radius of curvature is, for example, equal to or longer than 1 mm. The radius of curvature of the curved portion 67 may be equal to or longer than 1.5 mm or equal to or longer than 2.0 mm.

A curved portion 68 may be provided also at the boundary portion between the rising portion 63 and the connection portion 64. The curved portion 68 may have a curved surface that is formed not intentionally. The radius of curvature of the curved portion 67 may be greater than the radius of curvature of the curved portion 68.

Providing the curved portion 67 at the boundary portion between the rising portion 63 and the joint portion 62 allows the solder portion 80 to more easily go upward along the curved portion 67 when the solder portion 80 provided between the joint portion 62 and the plated layer 38 is heated for reflow or the like. As a result, lateral expansion of the solder portion 80 to reach the guard ring 34 can be suppressed.

In this way, providing the curved portion 67 makes the solder portion 80 more unlikely to reach the guard ring 34 even if the distance between the rising portion 63 and the guard ring 34 is decreased. The semiconductor element 30 can accordingly be downsized. Alternatively, the necessary distance between the gate runner 32 and the rising portion 63 can easily be secured.

In the plane parallel to the upper surface of the semiconductor element 30, a third distance L3, which is the shortest distance between an end of the joint portion 62 and the gate runner 32 not intersecting the end, with the end opposite to the rising portion 63, may also be equal to or longer than 1 mm. The strain at the end of the joint portion 62 may become larger than the strain at the central portion of the joint portion 62. For this reason, the third distance L3 may preferably be equal to or longer than 1 mm. However, because strain at the end of the joint portion 62 is smaller than the strain at the rising portion 63, the third distance L3 may be shorter than the first distance L1.

In the plane parallel to the upper surface of the semiconductor element 30, a fourth distance L4, which is the shortest distance between the end of the joint portion 62 and the guard ring 34, with the end opposite to the rising portion 63, may also be equal to or longer than 1 mm. Expansion of the solder portion 80 to reach the guard ring 34 can thereby be suppressed also at the end of the joint portion 62, with the end opposite to the rising portion 63. Note that the first distance L1 may be longer than any of the second distance L2, the third distance L3, and the fourth distance L4.

Figure 5:
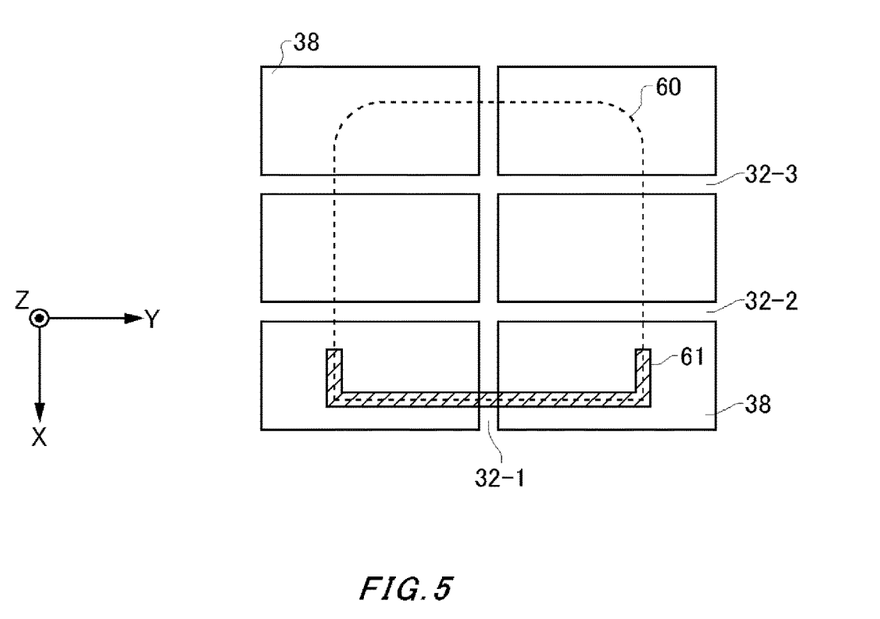
FIG. 5 is a schematic view showing a region 61 with large strain that is generated by a metal connecting plate 60 in the plane parallel to the upper surface of the semiconductor element 30.

FIG. 5 is a schematic view showing a region 61 with large strain that is generated by the metal connecting plate 60 in the plane parallel to the upper surface of the semiconductor element 30. The region 61 includes a region along the rising portion 63 and a region that is at an end of the joint portion 62 and is in the vicinity of the rising portion 63. In the vicinity of the rising portion 63, stress received from the rising portion 63 increases due to the temperature change, so that the strain becomes larger. As described above, the gate runner 32 and the guard ring 34 are preferably arranged separate from the region 61.

Figure 6:
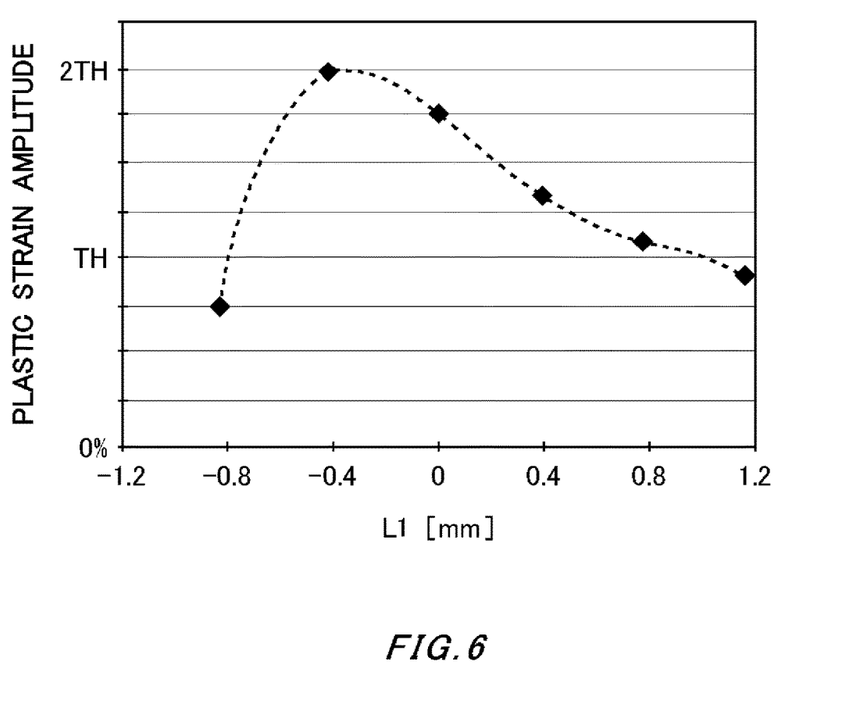
FIG. 6 is a graph showing a relationship between the first distance L1 and plastic strain amplitude in an upper surface of an upper-surface electrode 82.

FIG. 6 is a graph showing a relationship between the first distance L1 and plastic strain amplitude in the upper surface of the upper-surface electrode 82. In the present example, the upper-surface electrode 82 is formed of Al—Si and has a thickness of 5 μm. The plated layer 38 is formed of nickel and has a thickness of 4.5 μm. The solder portion 80 is formed of Sn-0.7Cu and has a thickness of 150 μm. The metal connecting plate 60 is formed of copper (C1020-1/2H: linear expansion coefficient is $16.7 \times 10^{-6}/° C$.) and has a thickness of 0.5 mm. The height of the rising portion 63 of the metal connecting plate 60 is 3.4 mm.

In FIG. 6, the first distance L1 between the rising portion 63 and the gate runner 32-2 was set positive when the rising portion 63 was arranged between the guard ring 34 and the gate runner 32-2 as shown in FIG. 3. The first distance L1 between the rising portion 63 and the gate runner 32-2 was also set negative when the rising portion 63 was arranged between the gate runner 32-2 and the gate runner 32-3. The condition was also that the solder portion 80 did not reach the guard ring 34.

The semiconductor device 100 was also examined with respect to the relationship between power cycle life and the plastic strain amplitude. The plastic strain amplitude and the power cycle life are approximately proportional. TH indicates the plastic strain amplitude required to achieve 50,000 cycles as a target life, which is proven by the examination. The power cycle life of 50,000 cycles can meet the specification required for general products.

Note that the power cycle life refers to the number of cycles in which cracks are generated in the upper-surface electrodes 82 in a certain percentage of semiconductor devices 100 when on and off operations are repeatedly performed on the semiconductor devices 100 including, for example, power devices such as IGBT, thereby repeatedly applying thermal stress to the devices 100 using the heat generated from the devices 100. In the present example, the temperature of the semiconductor element 30 was raised from 25° C. to 175° C. in one second and then lowered down to 25° C. over 9 seconds.

As shown in FIG. 6, by setting the first distance L1 to equal to or longer than 1.0 mm, the plastic strain amplitude can be made equal to or lower than a threshold TH. The required target life can thereby be achieved. Note that if the first distance L1 was excessively increased in the negative direction, the distance between the gate runner 32-3 and the rising portion 63 became too short, so that the plastic strain amplitude at the triple junction of the gate runner 32-3 became large.

Figure 7:
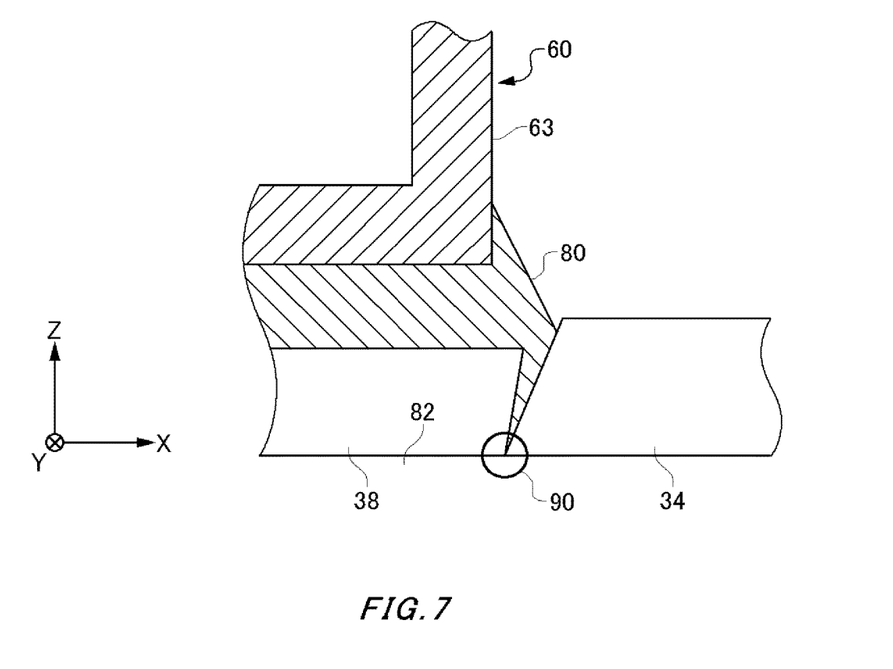
FIG. 7 is an enlarged partial view illustrating a triple junction 90.

FIG. 7 is an enlarged partial view illustrating the triple junction 90. FIG. 7 shows the triple junction 90 in the vicinity of the guard ring 34. When polyimide or the like in the guard ring 34 contracts, a gap is generated between the guard ring 34 and the plated layer 38.

At this time, if the distance between the guard ring 34 and the metal connecting plate 60 is too short, the solder portion 80 between the metal connecting plate 60 and the plated layer 38 reaches the triple junction 90 to enter into the gap between the guard ring 34 and the plated layer 38. If the rising portion 63 of the metal connecting plate 60 expands or contracts in the upward and downward directions in this state, stress is applied to the upper surface of the upper-surface electrode 82 via the solder portion 80, thereby generating plastic strain in the upper-surface electrode 82. If the amplitude of the plastic strain in the upward and downward directions becomes too large, the life of the semiconductor device 100 is shortened. In contrast, according to the semiconductor device 100 illustrated with reference to FIG. 1 through FIG. 6, because the triple junction and the rising portion 63 are arranged to be separate from each other, the life of the semiconductor device 100 can be prolonged.

Figure 8:
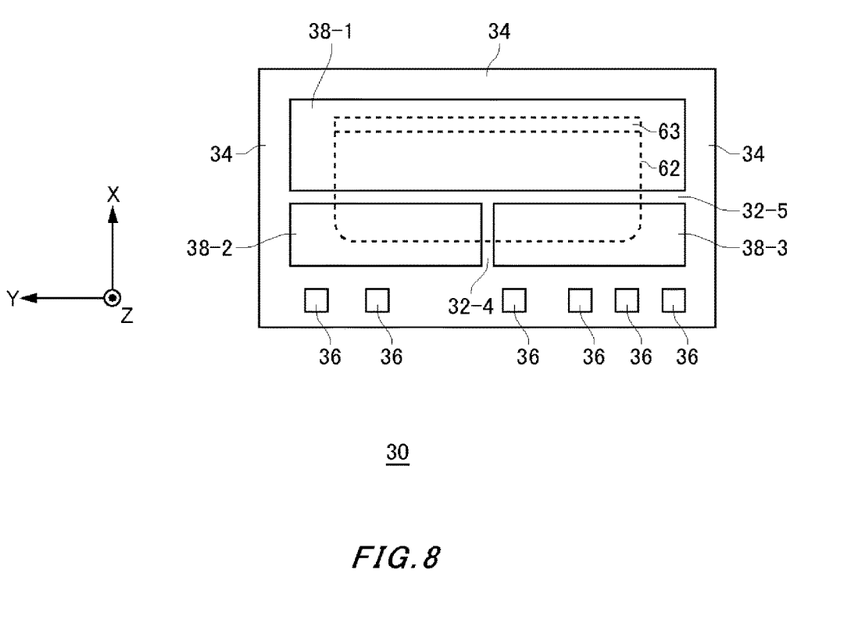
FIG. 8 is a diagram showing another exemplary upper surface of the semiconductor element 30.

FIG. 8 is a diagram showing another exemplary upper surface of the semiconductor element 30. In the present example, in the plane parallel to the upper surface of the semiconductor element 30, the rising portion 63 does not intersect with any gate runner 32. Such a configuration can further prolong the life of the semiconductor device 100.

The plated layer 38 is divided into a plurality of compartments by the gate runner 32. In the present example, the plated layer 38 is divided into compartments of a plated layer 38-1, a plated layer 38-2, and a plated layer 38-3. The area of the plated layer 38-1 compartment in the plane parallel to the upper surface of the semiconductor element 30 is larger than that of any other compartment. The length of the plated layer 38-1 compartment is also longer than that of any other compartment in a direction (the X-axis direction in the present example) in which the joint portion 62 extends above the upper surface of the semiconductor element 30.

The rising portion 63 of the present example is arranged above the plated layer 38-1 compartment that is largest of the compartments of the plated layer 38. The joint portion 62 is also arranged across all of the compartments of the plated layer 38. The metal connecting plate 60 can thereby be easily arranged provided that the rising portion 63 and the gate runner 32 do not intersect each other.

For example, the plated layer 38 is divided by a gate runner 32-5 parallel to the rising portion 63. A gate runner 32-4 orthogonal to the gate runner 32-5 does not divide the compartment that is one of the compartments of the plated layer 38 divided by the gate runner 32-5 parallel to the rising portion 63 and where the rising portion 63 is arranged. On the other hand, the gate runner 32-4 divides the compartments that are among the compartments of the plated layer 38 divided by the gate runner 32-5 and where the rising portion 63 is not arranged.

Note that the rising portion 63 is preferably arranged at an end of the joint portion 62, with the end opposite to the pad 36. This arrangement can suppress interference between the wire and the like connected to the pad 36 and the metal connecting plate 60. The upper surface of the semiconductor element 30 of the present example is rectangular. In the plane parallel to the upper surface of the semiconductor element 30, the rising portion 63 is arranged along the longitudinal direction (the Y-axis direction) of the upper surface of the semiconductor element 30. This arrangement can expand the range to which stress is applied by the rising portion 63, and can suppress local application of a large stress.

Figure 9:
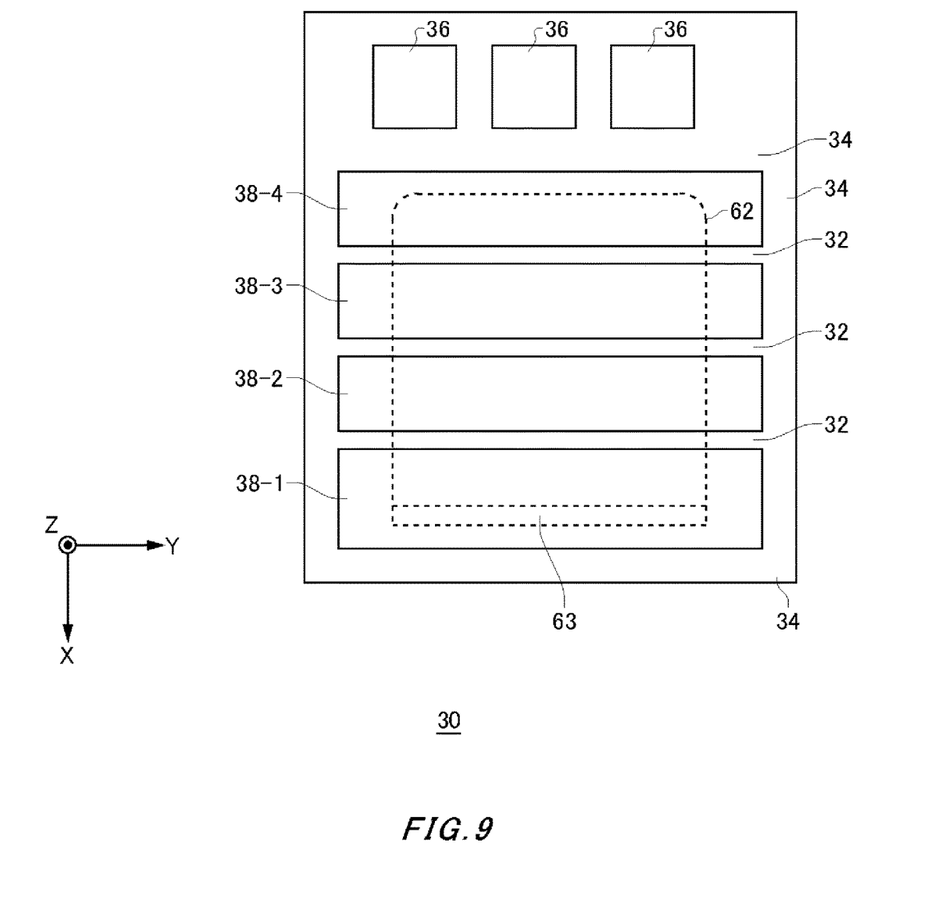
FIG. 9 is a diagram showing another exemplary upper surface of the semiconductor element 30.

FIG. 9 is a diagram showing another exemplary upper surface of the semiconductor element 30. Also in the present example, in the plane parallel to the upper surface of the semiconductor element 30, the rising portion 63 does not intersect with any gate runner 32.

In the present example, all of the gate runners 32 are arranged in a stripe pattern along the direction (Y-axis direction in the present example) parallel to the rising portion 63. The plated layer 38 is thereby divided into a plurality of compartments in the X-axis direction. Note that the area of the plated layer 38-1 compartment where the rising portion 63 is arranged is larger than that of any other compartment of the plated layer 38. More specifically, the width of the plated layer 38-1 in the X-axis direction is larger than the width of any other compartment of the plated layer 38. The distance in the X-axis direction between the rising portion 63 and the gate runner 32 and the distance between the rising portion 63 and the guard ring 34 can thereby be easily secured.

Figure 10:
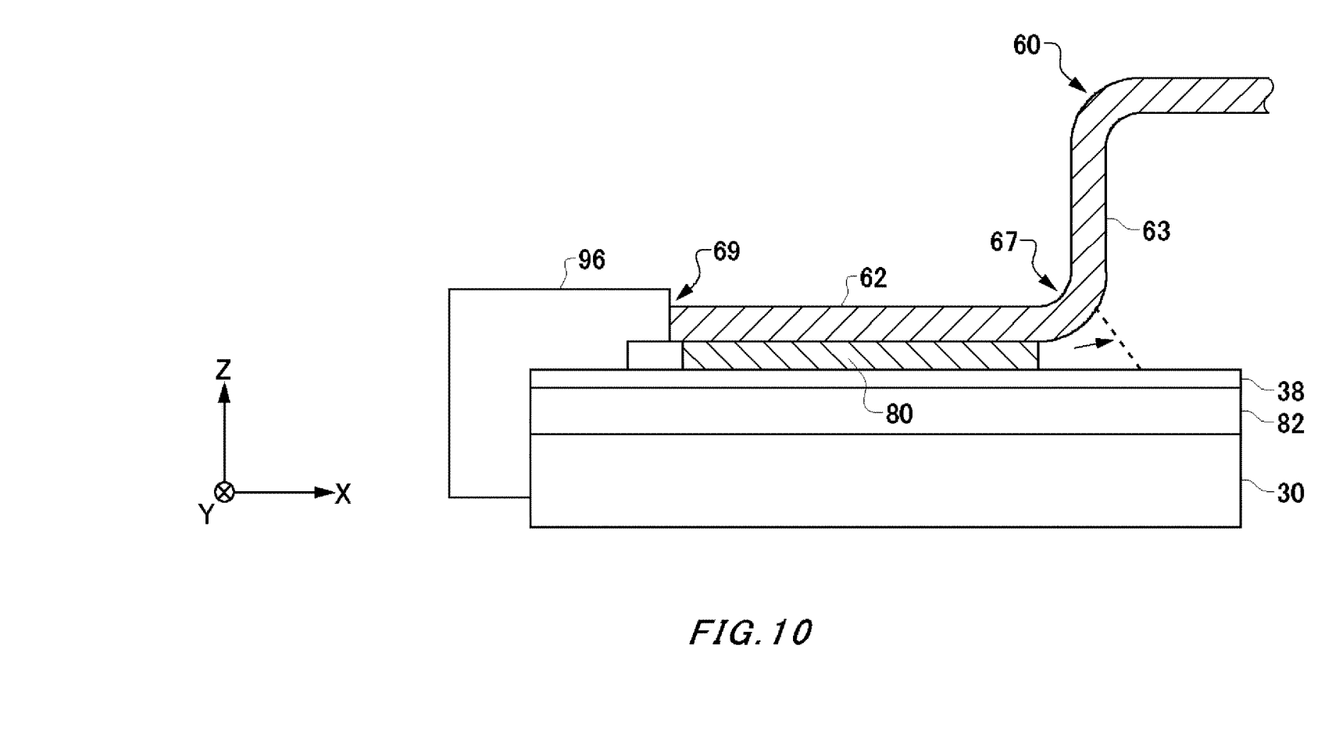
FIG. 10 is a diagram showing a process in a method for manufacturing the semiconductor device 100.

FIG. 10 is a diagram showing a process in a method for manufacturing the semiconductor device 100. In the process, the solder portion 80 is heated, with the metal connecting plate 60 positioned using a jig 96, and the metal connecting plate 60 is fixed to the plated layer 38.

The jig 96 abuts an end 69 of the joint portion 62, with the end 69 opposite to the rising portion 63. With the curved portion 67 provided in the metal connecting plate 60, the solder portion 80 flows more toward the curved portion 67 side than toward the end 69 side. In this case, force is applied to the metal connecting plate 60, so that the metal connecting plate 60 tries to move toward the jig 96 side. However, because the jig 96 abuts the end 69 of the metal connecting plate 60, movement of the metal connecting plate 60 can be suppressed when the solder portion 80 is heated. As a result, it becomes easier to secure the distance between the rising portion 63 and the gate runner 32 and the distance between the rising portion 63 and the guard ring 34.

Figure 11:
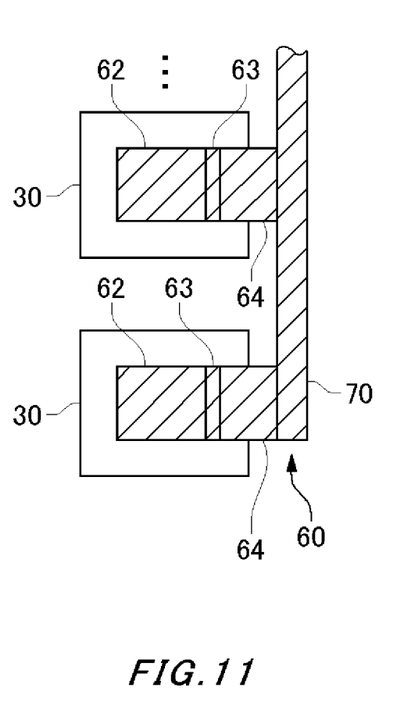
FIG. 11 is a diagram showing another exemplary metal connecting plate 60.

FIG. 11 is a diagram showing another exemplary metal connecting plate 60. The metal connecting plate 60 of the present example is connected to a plurality of semiconductor elements 30. For example, the metal connecting plate 60 has a common portion 70 that is linearly provided in the plane parallel to the upper surface of the semiconductor element 30 and has a plurality of connection portions 64 protruding from the common portion 70. Each connection portion 64 extends above the semiconductor element 30 corresponding thereto. The rising portion 63 and the joint portion 62 are provided at the edge of each connection portion 64. Also in such an example, the distance between the gate runner 32 and the guard ring 34 in each rising portion 63 is preferably secured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS

10: cooling portion; 12: case; 14: solder portion; 16: insulating substrate; 18: circuit portion; 20: circuit portion; 22: sealing resin; 24: solder portion; 25: solder portion; 26: metal plate; 30: semiconductor element; 32: gate runner; 34: guard ring; 36: pad; 38: plated layer; 60: metal connecting plate; 61: region; 62: joint portion; 63: rising portion; 64: connection portion; 65: rising portion; 66: joint portion; 67: curved portion; 68: curved portion; 69: end; 70: common portion; 80: solder portion; 82: upper-surface electrode; 90: triple junction; 96: jig; 100: semiconductor device

What is claimed is:

1. A semiconductor device comprising:
a semiconductor element;
an upper-surface electrode formed on an upper surface of the semiconductor element;
a plated layer formed on an upper surface of the upper-surface electrode;
one or more gate runners penetrating the plated layer and formed to extend in a predetermined direction above the upper surface of the semiconductor element;
a metal connecting plate arranged above the plated layer and electrically connected to the upper-surface electrode and
a guard ring formed on the upper surface of the upper-surface electrode and outside the plated layer,
wherein the metal connecting plate has a joint portion parallel to the upper surface of the semiconductor element and has a rising portion at an end of the joint portion, the rising portion extending in a direction away from the upper surface of the semiconductor element,
in a plane parallel to the upper surface of the semiconductor element, a first distance, which is a shortest distance between the rising portion and the gate runner not intersecting the rising portion, is equal to or longer than 1 mm, and a second distance, which is a shortest distance between the guard ring and the rising portion, is equal to or longer than 1 mm.

2. The semiconductor device according to claim 1, wherein the first distance is longer than the second distance.

3. The semiconductor device according to claim 1, further comprising a solder portion provided between the metal connecting plate and the plated layer,
wherein the solder portion is not in contact with the guard ring.

4. The semiconductor device according to claim 1, wherein a curved portion whose radius of curvature is equal to or longer than 1 mm is provided at a boundary portion between the rising portion and the joint portion.

5. The semiconductor device according to claim 1, wherein in the plane parallel to the upper surface of the semiconductor element, a third distance, which is a shortest distance between an end of the joint portion and the gate runner not intersecting the end, with the end opposite to the rising portion, is equal to or longer than 1 mm.

6. The semiconductor device according to claim 5, wherein the third distance is shorter than the first distance.

7. The semiconductor device according to claim 1, wherein in the plane parallel to the upper surface of the semiconductor element, the rising portion does not intersect with any of the gate runners.

8. The semiconductor device according to claim 7, wherein in the plane parallel to the upper surface of the semiconductor element, the plated layer is divided into a plurality of compartments by the gate runner, and
the rising portion is provided above a compartment that is largest of the compartments of the plated layer.

9. The semiconductor device according to claim 1, wherein in the plane parallel to the upper surface of the semiconductor element, the rising portion is arranged along a longitudinal direction of the semiconductor element.

10. The semiconductor device according to claim 1, further comprising a gate pad arranged on the upper surface of the semiconductor element,
wherein the rising portion is provided at an end of the joint portion, with the end opposite to the gate pad.

* * * * *